United States Patent
Sandström

(10) Patent No.: US 7,542,129 B2
(45) Date of Patent: Jun. 2, 2009

(54) PATTERNING APPARATUSES AND METHODS FOR THE SAME

(75) Inventor: Torbjörn Sandström, Pixbo (SE)

(73) Assignee: Micronic Laser Systems AB, Taby (SE)

( * ) Notice: Subject to any disclaimer, the term of this patent is extended or adjusted under 35 U.S.C. 154(b) by 625 days.

(21) Appl. No.: 11/204,991

(22) Filed: Aug. 17, 2005

(65) Prior Publication Data

US 2006/0039651 A1 Feb. 23, 2006

Related U.S. Application Data

(63) Continuation-in-part of application No. PCT/SE2004/000253, filed on Feb. 25, 2004.

(30) Foreign Application Priority Data

Feb. 28, 2003 (SE) .................................. 0300516

(51) Int. Cl.
*G03B 27/54* (2006.01)
*G03B 27/42* (2006.01)
(52) U.S. Cl. .......................................... 355/67; 355/53
(58) Field of Classification Search .................. 355/53, 355/55, 67–71; 250/548, 492.2; 430/5, 311
See application file for complete search history.

(56) References Cited

U.S. PATENT DOCUMENTS

| | | | |
|---|---|---|---|
| 6,080,994 A | 6/2000 | Carrott et al. | |
| 6,407,766 B1 * | 6/2002 | Ramanujan et al. | 347/239 |
| 6,473,237 B2 * | 10/2002 | Mei | 359/619 |
| 6,618,118 B2 * | 9/2003 | Minnaert et al. | 355/30 |
| 6,624,880 B2 * | 9/2003 | Sandstrom et al. | 355/71 |
| 6,717,097 B1 | 4/2004 | Sandstrom et al. | |
| 6,778,257 B2 * | 8/2004 | Bleeker et al. | 355/67 |
| 6,831,768 B1 * | 12/2004 | Cebuhar et al. | 359/291 |
| 6,870,554 B2 * | 3/2005 | Jain | 345/697 |
| 2003/0160980 A1 | 8/2003 | Olsson et al. | |

OTHER PUBLICATIONS

English-language translation of Chinese Office Action dated Mar. 21, 2008 for corresponding Chinese Patent Application No. 2004800051027.

* cited by examiner

*Primary Examiner*—Hung Henry Nguyen
(74) *Attorney, Agent, or Firm*—Harness, Dickey & Pierce, P.L.C.

(57) ABSTRACT

An apparatus for patterning a workpiece may include at least two spatial light modulators. The at least two spatial light modulators may receive and relay electromagnetic radiation from an electromagnetic radiation source toward a workpiece. The electromagnetic radiation may be split into at least two beams in an optical plane between the at least two spatial light modulators and at least one of an illuminator pupil and a conjugate optical plane. Each of the at least two spatial light modulators may receive a corresponding one of the at least two beams.

37 Claims, 4 Drawing Sheets

US 7,542,129 B2

PATTERNING APPARATUSES AND METHODS FOR THE SAME

PRIORITY STATEMENT

This non-provisional U.S. application is a continuation-in-part under 35 U.S.C. § 111(a) of PCT International Application No. PCT/SE2004/000253, which has an international filing date of Feb. 25, 2004, which designated the United States of America, and which claims priority under 35 U.S.C. § 119 of Swedish Patent Applicant No. 0300516-2, filed on Feb. 28, 2003, the entire contents of both of which are hereby incorporated by reference.

BACKGROUND OF THE INVENTION

1. Field of the Invention

Example embodiments of the present invention relate to laser lithography, patterning apparatuses and methods for the same.

2. Description of the Conventional Art

Spatial light modulation with optical micro-electro-mechanical-system (MEMS) devices may provide parallel writing in conventional UV-lithography. A conventional spatial light modulator (SLM) chip may include, for example, dynamic random access memory (DRAM) CMOS circuitry with several million individually addressable pixels on top. The pixels may be deflected by a difference in electrostatic force between a mirror element and an address electrode. In one example, a pattern generator using an SLM may have a smaller field stop for exposing a series of images of the SLM. A workpiece may be arranged on a stage, which may move, for example, in a continuous, substantially continuous, step-wise, or substantially stepwise, manner. An electromagnetic radiation source (e.g., pulsed electromagnetic radiation source, such as, a pulsed laser, a flash lamp, a flash from a synchrotron light source, etc.) flashes to freeze an image of the SLM on the workpiece. The SLM may be reprogrammed with a different pattern before each flash such that a contiguous image may be composed on the workpiece.

Conventional integrated circuit manufacturing techniques may use a number of masks or reticles (e.g., greater than 30) including a pattern of a layer in the integrated circuit. These conventional masks or reticles may be manufactured in a lithographical manner using, for example, electron beams or laser beams for exposing a layer of material sensitive to the type of beam chosen. The mask material may be transmissive and a thin layer of opaque material may be attached on one side. In the thin material the pattern of a layer of the integrated circuit may be created. The mask may have, for example, pattern N times larger than the pattern to be printed on the semiconducting substrate for forming the integrated circuit. The reduction in size may be performed in a stepper, which uses the mask(s) for forming the integrated circuit.

Conventional direct-writers may be based on electron beams (e.g., shaped beams), in which the pattern may be assembled from flashes, each of which may define a geometrical figure. Other conventional systems may use raster scanning of Gaussian beams. Conventional mask writers, which use beams of electrons or laser beams for forming the pattern on a workpiece, may use lower scanning speeds and may scan in one dimension.

Other conventional SLM writers disclosed, for example, in U.S. Pat. No. 6,717,097 and U.S. Patent Publication No. 2003/0160980, the entire contents of both of which are incorporated herein by reference, may produce a pattern (e.g., a bitmap pattern), for example, by printing an entire frame of a pattern in one flash.

A conventional spatial light modulator (SLM) may include a number of modulator elements, which may be set in a way to such that a pattern may be formed. Conventional SLMs may be exposed to any type of electromagnetic radiation, for example, deep ultra violet (DUV) or extreme ultra violet (EUV) for forming the pattern on the mask or any other workpiece.

SUMMARY OF THE INVENTION

One or more example embodiments of the present invention provide apparatuses for patterning a workpiece in a faster and/or more flexible manner.

An apparatus for patterning a workpiece according to an example embodiment of the present invention may include at least two spatial light modulators. The at least two spatial light modulators may receive and relay electromagnetic radiation, from an electromagnetic radiation source, toward a workpiece. The electromagnetic radiation may be split into at least two beams in an optical plane between the at least two spatial light modulators and at least one of an illuminator pupil and a conjugate optical plane. Each of the at least two spatial light modulators may receive a respective one of the at least two beams.

A method for patterning a workpiece according to an example embodiment of the present invention may include splitting the electromagnetic radiation into at least two beams in an optical plane between an object plane and at least one of an illuminator pupil and another conjugate optical plane. Each of the at least two beams may impinge on a respective one of at least two spatial light modulators, and a workpiece may be patterned by directing the electromagnetic radiation from the at least two beams toward the workpiece.

In example embodiments of the present invention, the electromagnetic radiation the beam may be split by a beam splitting element, which may be at least partially reflective. The beam splitting element may be a diffractive optical element arranged in the optical plane. The diffractive optical element may include at least one of a volume holographic element (HOE), kinoforms, a Fresnel zone plate, and binary optical element (BOE) or at least one of a prism and facetted mirror.

In example embodiments of the present invention, the relayed electromagnetic radiation may form images of the at least two spatial light modulators. The images may be non-adjacent to each other.

In example embodiments of the present invention, each of the at least two spatial light modulators may include a plurality of pixel elements, and at least one of the at least two spatial light modulators may be reflective or transmissive and/or may be operated in an analog mode or a digital mode. At least one of the at least two spatial light modulators may form an image on the workpiece during a first writing pass and at least one other of the at least two spatial light modulators may form an image on the workpiece during a second writing pass.

In example embodiments of the present invention, at least two images produced by the at least two spatial light modulators may have different patterns.

In example embodiments of the present invention, the electromagnetic radiation source may be a laser and the electromagnetic radiation may be a laser beam having a wavelength of about 248 nm, about 193 nm, about 157 nm or about 13 nm.

In example embodiments of the present invention, at least one of the at least two spatial light modulators may be a grating light valve.

In example embodiments of the present invention, the electromagnetic radiation may be filtered by a Fourier filter.

In example embodiments of the present invention, at least two relayed images of the at least two spatial light modulators may be patterned during at least a first and a second writing pass.

In example embodiments of the present invention, object pixels included in one of the at least two spatial light modulators may be at least one of a different size and a different shape relative to object pixels included in another one of the at least two spatial light modulators.

In example embodiments of the present invention, each of the at least two spatial light modulators may be arranged on at least one corresponding manipulator.

In example embodiments of the present invention, the at least two spatial light modulators may be separated from each other at a distance larger than an image created by at least one of the at least two spatial light modulators.

In example embodiments of the present invention, at least one image patterned by one of the at least two spatial light modulators in a first writing pass may be displaced relative to an image patterned by another one of the at least two spatial light modulators in another writing pass. The at least one image produced by one of the at least two spatial light modulators may be displaced by at least a portion of at least one object pixel relative to another image produced by another one of the at least two spatial light modulators.

In example embodiments of the present invention, images produced by each of the at least two spatial light modulators may be the same or different and/or may at least partially overlap each other or may be non-overlapping.

In example embodiments of the present invention, a fan out device may direct each of the at least two beams toward a corresponding one of the at least two spatial light modulators.

In example embodiments of the present invention, each of the at least two beams may be reflected such that they impinge on the workpiece.

DETAILED DESCRIPTION OF EXAMPLE EMBODIMENTS OF THE PRESENT INVENTION

The following detailed description of example embodiments of the present invention is made with reference to the figures. However, these example embodiments are described for illustration purposes and not to limit its scope, which is defined by the claims. Those of ordinary skill in the art will recognize a variety of equivalent variations on the description that follows.

Further, example embodiments of the present invention are described with reference to an analog SLM; however, it will be understood that any suitable SLM may be used; for example, digital SLMs such as digital micro-mirror devices and/or SLMs at least partially comprised of, for example, reflective and/or transmissive pixels. Example embodiments are described with reference to an excimer laser source; however, it will be understood that any suitable electromagnetic radiation source may be used, for example, a Nd-YAG laser, ion laser, Ti sapphire laser, free electron laser or other pulsed fundamental frequency lasers, flash lamps, laser plasma sources, synchrotron light sources, etc.

Figure 1:
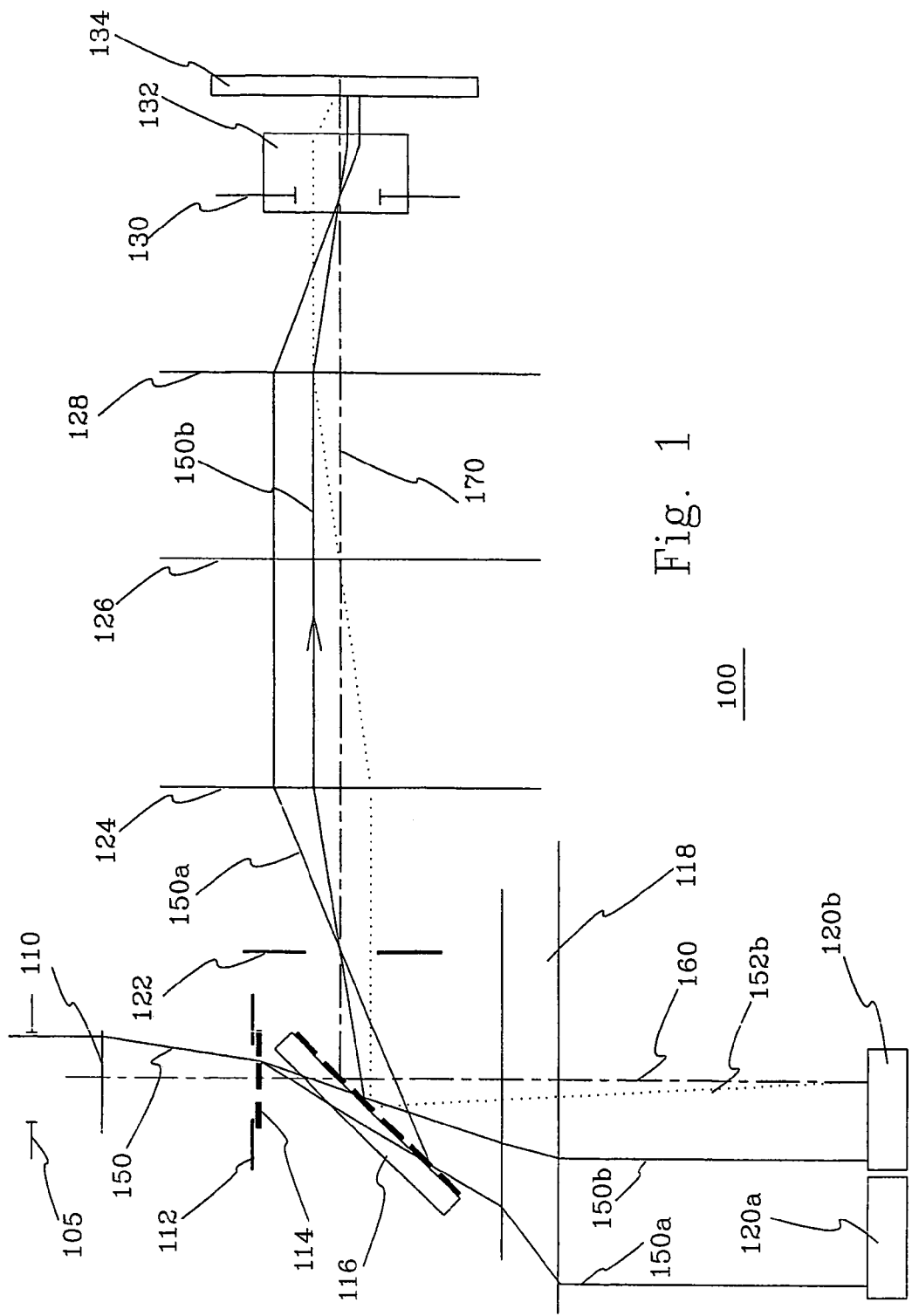
FIG. 1 illustrates a patterning apparatus according to an example embodiment of the present invention.

FIG. 1 depicts an example embodiment of a pattern generator 100 according to an example embodiment of the present invention. The pattern generator may include a field stop 105, a first lens arrangement 110, an illuminator pupil 112, a beam splitting device 114, a semi-transparent beam splitter 116, a first relay lens 118, a first spatial light modulator 120a, a second spatial light modulator 120b, a system pupil 122, a second relay lens 124, an intermediate image plane 126, a tube lens 128, a final aperture 130, a final lens 132, an electromagnetic beam 150, 150a, 150b, 152a, and/or an optical axis 160, 170. A workpiece 134 may be positioned such that it may be impinged by the beam 150, 150a, 150b, and/or 152a.

Electromagnetic radiation 150 from an electromagnetic radiation source (not shown) may be directed onto the first lens arrangement 110 via the field stop 105, which may have a size and form corresponding to, for example, one SLM. The field stop 105 may be used in order to reduce (e.g., prohibit) light/radiation impinging on components other than the one or more SLMs 120a and 120b.

The electromagnetic radiation source may be a laser (e.g., an excimer laser) with an output wavelength of about 248 nanometers (nm), about 193 nm, about 157 nm or about 13 nm. However longer or shorter wavelengths may also be used. The electromagnetic radiation may be directed by the first lens arrangement 110, to the illuminator pupil 112 in an illuminator pupil plane. The illuminator pupil 112 may filter the electromagnetic radiation 150 (e.g., to a desired degree). A numerical aperture (NA) in an object plane (e.g., the plane at which the spatial light modulators (SLMs) may be arranged) may determine (or be used to determine) the size of the illuminator pupil 112. The illuminator pupil 112 may control (e.g., restrict) angles of incidence of the electromagnetic radiation passing through the field stop 105.

The beam may pass through the beam splitting device 114, which may split the beam into a plurality of beams (e.g., two or more beams). For example, the beam splitting device 114 may be a diffractive optical element such as a volume holographic element (HOE), a kinoform, a Fresnel zone plate, a binary optical element (BOE) or any other suitable diffractive optical element. In another example, a partially reflecting optical element may be used in place of, or in combination with, a diffractive optical element. The partially reflecting optical element may be a prism, a facetted mirror or any other at least partially reflective optical element.

The beam splitting device 114 may be arranged in an optical plane between the illuminator pupil 112 and the SLMs 120a and 120b arranged in the object plane. However, a lens system (e.g., a relay lens system) may allow for the arranging of the beam splitting device 114 in another plane (e.g., any other suitable conjugate plane). The conjugate plane may be an optical equivalent plane or a plane with a 1-to-1 imaging ratio relative to the object plane. In an example embodiment of the present invention, a relay lens system may be arranged between the electromagnetic radiation source (not illustrated) and the field stop 105, and may produce a conjugate illuminator aperture plane, which may be further away from the spatial light modulators.

Referring back to FIG. 1, the electromagnetic radiation may be split into a plurality of beams (e.g., at least two beams) 150*a* and 150*b*. Although FIG. 1 illustrates two beams 150*a* and 150*b*, it will be understood that the electromagnetic radiation may be split into any suitable number of beams by one or a plurality of beam splitting devices arranged, for example, serially or in parallel. The beams 150*a* and 150*b* may be transmitted through a semi-transparent beam splitter 116, which may allow the beams 150*a* and 150*b* to pass through when coming from the direction of the electromagnetic source and reflecting the beams 150*a* and 150*b* when coming from a direction of the SLMs 120*a* and 120*b*.

Having passed the semi-transparent beam splitter 116, the beams 150*a*, 150*b* may be directed through a first relay lens 118, which may telecentrize the beams 150*a* and 150*b* on the SLMs 120*a* and 120*b*. That is, for example, the first relay lens 118 may make the beams on the SLMs 120*a* and 120*b* telecentric.

Beam 150*a* may be directed to SLM 120*a* and beam 150*b* may be directed to SLM 120*b*. In the example embodiment as illustrated in FIG. 1, the SLMs may be reflective SLMs, which may include pixel elements (e.g., micro-mirrors); however, other reflective SLMs such as grating light valves, SLMs based on viscose elastic layers, etc., may be used. Reflective SLMs may come in two categories, deflective and diffractive SLMs, where the deflective SLMs may be operated in a digital mode and the diffractive SLMs may be operated in an analog mode. Another example type of SLMs, which may be used in example embodiments of the present invention, may be transmissive SLMs, such as, liquid crystal SLMs.

In an example embodiment of the present invention all, or substantially all, of the SLMs may be the same, or substantially the same. However, in other example embodiments of the present invention the SLMs may be different, for example, a portion of the SLMs may be transmissive and another portion of the SLMs may be reflective.

In example embodiments of the present invention, each SLM may be operated in the same manner or in a different manner. For example, at least one SLM may operate in an analog mode and at least one SLM may operate in a digital mode. In example embodiments of the present invention, each SLM may have pixels having the same or different size, shape and/or quantity. For example, a size of pixels in at least one SLM may be different from the size of pixels in at least one other SLM, and/or at least one SLM may include a different number of pixel elements relative to another SLM. It will be understood that the above discussed variations (e.g., size, shape, quantity, operation mode, etc.) may be combined in any suitable manner, for example, each SLM may be identical or at least one SLM may have pixel elements having a different size and shape relative to another SLM.

Returning to FIG. 1, the relayed beam from the spatial light modulators 120*a* and 120*b* may again be transmitted through the first relay lens 118 and reflected by the semi-transparent beam splitter 116, which may lead the beams into an optical path with an optical axis 170. The optical axis 170 may be perpendicular, or substantially perpendicular, to the workpiece 134 in an image plane. Optical axis 160 may be perpendicular, or substantially perpendicular, to the SLMs 120*a* and 120*b* in the object plane. The dotted line 152*b* in FIG. 1 may denote a marginal beam.

The beams may be reflected by the semi-transparent beam splitter 116, and the beams 150*a* and 150*b* may be directed toward the system pupil 122. The system pupil 122 may lie in a plane (e.g., a Fourier plane) between the illuminator pupil 112 and the aperture (e.g., the final aperture) 130. In example embodiments of the present invention, having, for example, an analog SLM, first and higher diffraction orders may be filtered out by the system pupil 122, which may also be referred to as a Fourier aperture.

The beams 150*a* and 150*b* may pass through a second relay lens 124, which may create an intermediate image 126 in an image plane (e.g., an aerial or intermediate image plane). The beams 150*a* and 150*b* may be directed to the tube lens 128 and the final lens 132, which may include the aperture 130. The tube lens 128 and the final lens 132 may telecentrize the illumination at the image plane (e.g., make the beams at the image plane telecentric). The aperture 130 and 230 may be sized and/or shaped in order to control stray light at the image plane.

Figure 3:
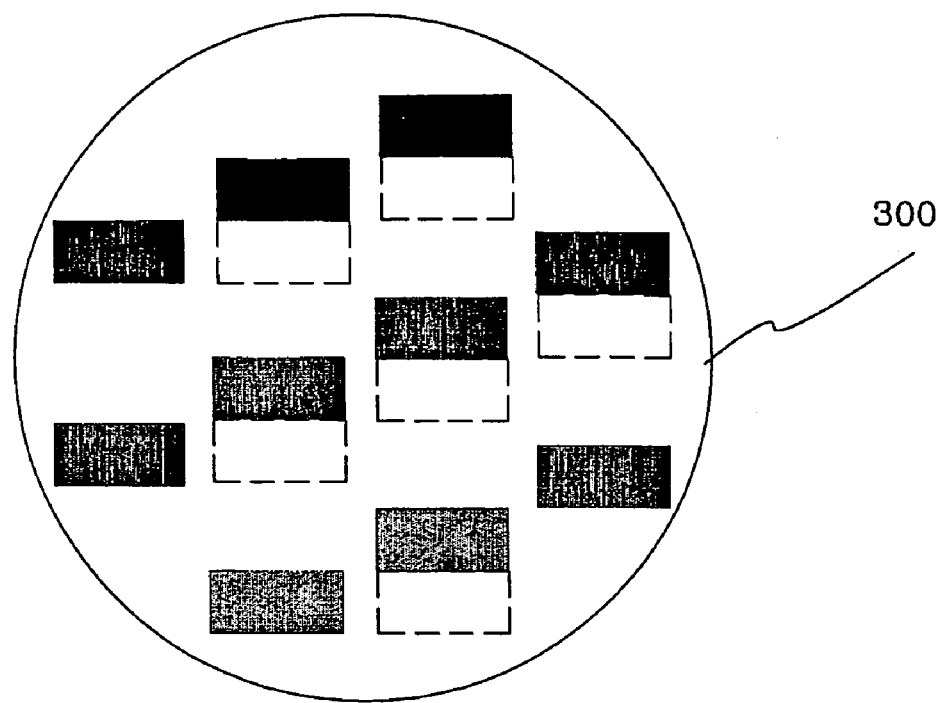
FIG. 3 illustrates an example of SLM images (e.g., stamps) formed on a workpiece from a writing pass performed by patterning apparatuses according to example embodiments of the present invention.

Beams from respective SLMs 120*a* and 120*b* may impinge the workpiece 134 at different locations, for example, adjacent to each other or non-adjacent to each other depending on, for example, a chosen writing technique. FIG. 3 illustrates an example arrangement of stamps from a plurality of SLMs (e.g., ten) in a single exposure onto a workpiece 300. The single exposure, as discussed herein, may be the imaging of the SLMs onto the workpiece in one event.

Using a single pass strategy, for example, a single exposure may be intense enough for exposing the layer sensitive to the wavelength in a single pass. In a multiple pass strategy, individual exposures may not have an intensity sufficient to expose the sensitive layer; however, the combination of individual and single exposures may expose the sensitive layer. In FIG. 3, a first exposure may be denoted by filled rectangles, where the rectangles represent the example images (e.g., stamps) of the SLMs. In a second exposure (e.g., a next exposure stage), a stage upon which the workpiece may be arranged, may be moved a distance equal, or substantially equal, to the width of the images on the workpiece. This exposure (e.g., the next exposure) may be denoted in FIG. 3 by dashed rectangles. Repeating the action of moving the stage and exposing the workpiece may perform a complete exposure of the workpiece. Between exposures, the SLMs may be loaded or reloaded with a new pattern description.

A distance between the SLMs in the object plane may be different in example embodiments of the present invention. For example, in an example embodiment of the present invention a distance between the SLMs in the object plane may be greater than corresponding images in the image plane, and room for manipulators for each SLM may be provided. The manipulator may tilt the SLM in any direction, allowing one or more (e.g., each) SLM to be parallel, or substantially parallel, and/or aligned to each other.

Figure 4:
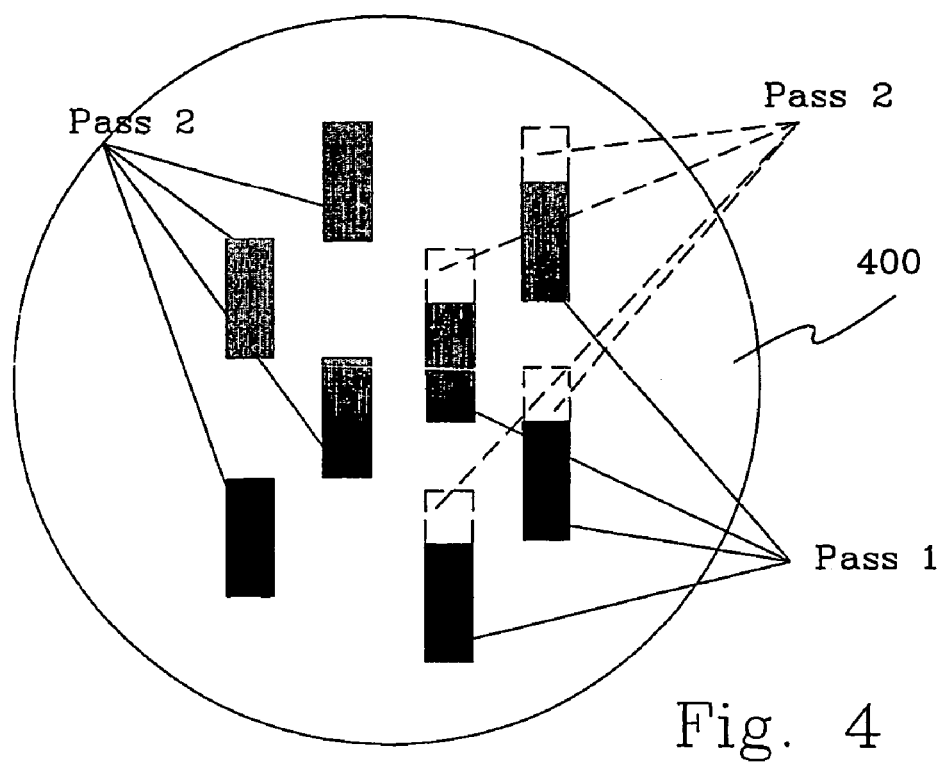
FIG. 4 illustrates another example of SLM images (e.g., stamps) formed on a workpiece during a first and second writing pass by patterning apparatuses according to example embodiments of the present invention.

The images may be non-overlapping or at least partially overlapping in a multipass writing strategy. The at least partial overlap may be, for example, an integer number of SLM pixels and/or portions of a SLM pixel and a possible integer number of SLM pixels. FIG. 4 illustrates a single exposure, which may include patterns belonging to a first writing pass, and a second writing pass onto a workpiece 400. In the example embodiment of the present invention shown in FIG. 4, the first and second writing passes, in one exposure, may be denoted by filled rectangles. The images in the first pass may be illustrated to be at least partially displaced relative to the images in the second pass. For example, the images in the first pass may partially overlap the stamps in the second pass. In another exposure, images belonging to different writing passes may partially overlap each other. In FIG. 4 the second pass in another exposure may be denoted by dashed rectangles, which may at least partially overlap the images belonging to the first pass. The first pass in the other exposure is not illustrated for reason of clarity only.

For example, in a two pass writing strategy, the first pass may be written with an SLM operated in an analog mode and a second pass may be written with an SLM operated in a digital mode. In example embodiments of the present invention, a reflective spatial light modulator may be used for one pass and a transmissive spatial light modulator may be used for another pass. In the example embodiment of the present invention as shown in FIG. 4, the first pass and the second pass may be written by the SLM operated in a digital mode. In example embodiments of the present invention, SLMs with different capability in the form of line width performance may be used. In FIG. 4 the first pass may be written with a coarser pattern definition using an SLM with larger pixels and/or a lesser number of pixels compared to the SLMs used to write the second pass. The second pass may use higher performance SLMs in order to adjust the dimensions of the lines to be patterned and/or create pattern enhancement features in a mask pattern. One or more example embodiments of the present invention may increase the writing speed and/or increase the sharpness of corners and/or optical proximity corrections in the form of scatter bars or other features.

In example embodiments of the present invention, the radiation intensity from different SLMs may differ with respect to their diffraction order, which may enhance the critical dimension control (CDC). In example embodiments of the present invention, introducing an attenuator in front of at least one spatial light modulator may alter the radiation intensity. In example embodiments of the present invention using, for example, a multipass writing strategy, a first pass may be written with a first intensity and a second pass may be written with another intensity; the first and second passes may belong to the same exposure as shown, for example, in FIG. 4.

Figure 2:
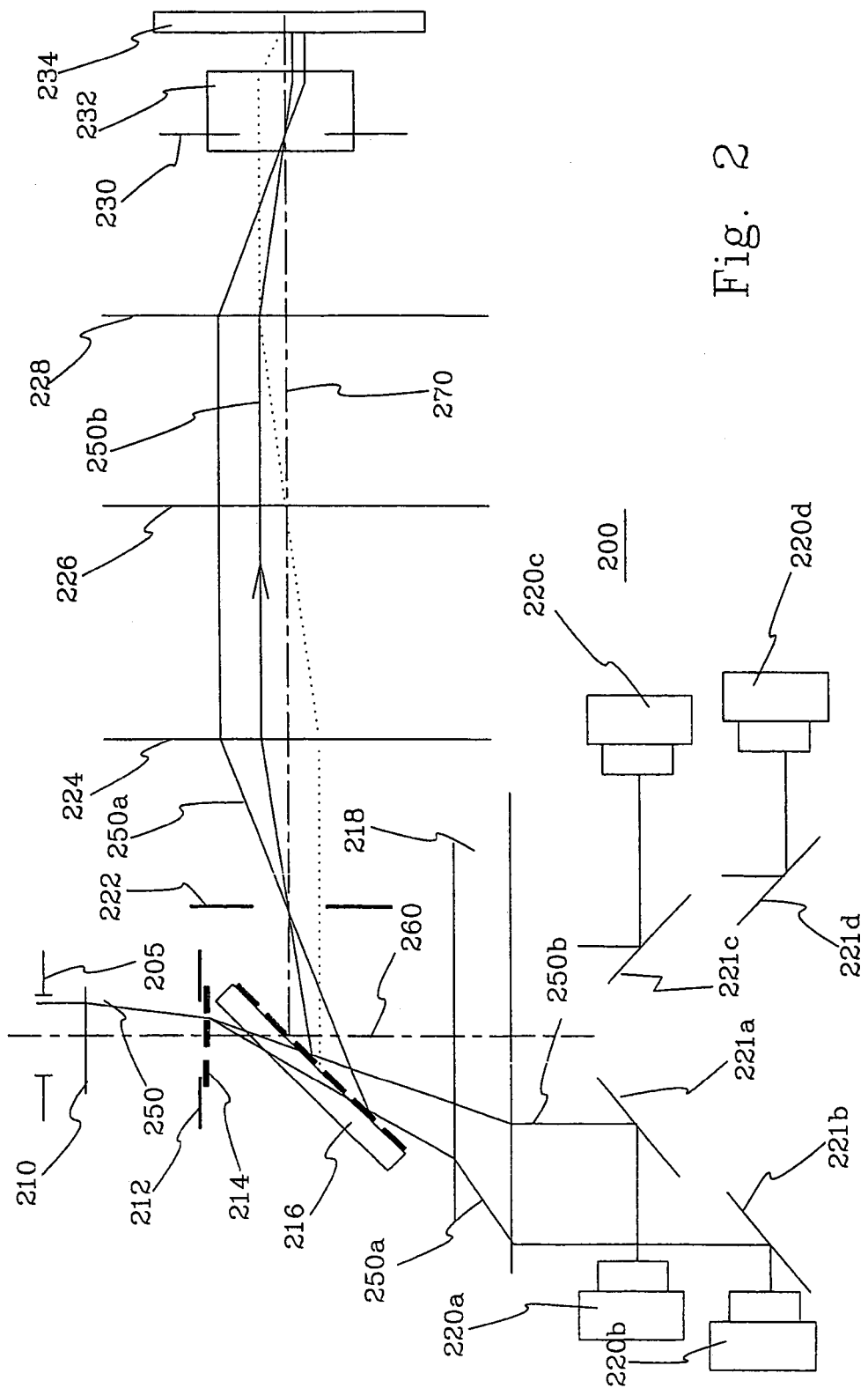
FIG. 2 illustrates a patterning apparatus according to another example embodiment of the present invention.

FIG. 2 illustrates another example embodiment of the present invention. The pattern generator may include a field stop 205, a first lens arrangement 210, an illuminator pupil 212, a beam splitting device 214, a semi-transparent beam splitter 216, a first relay lens 218, a first spatial light modulator 220a, a second spatial light modulator 220b, a system pupil 222, a second relay lens 224, an intermediate image plane 226, a tube lens 228, a final aperture 230, a final lens 232, an electromagnetic beam 250, 250a, 250b, 252a, and/or an optical axis 260 and 270. A workpiece 234 may be positioned such that it may be impinged by the beam 250 and/or 250b. The example embodiment of the present invention as shown in FIG. 2 may be similar, or substantially similar, to the example embodiment of the present invention shown in FIG. 1 except for the arrangement and number of SLMs.

As shown in FIG. 2, the pattern generator may include a plurality of (e.g., four) SLMs 220a, 220b, 220c, 220d, and the beams may be directed toward to the SLMs 220a, 220b, 220c, 220d by reflective devices (e.g., mirrors) 221a, 221b, 221c and/or 221d.

Figure 5:
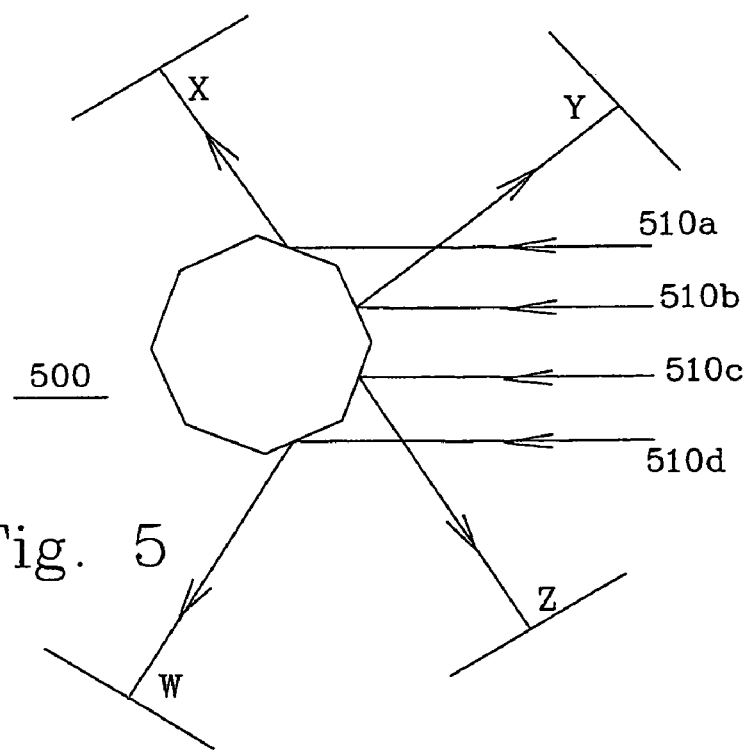
FIG. 5 illustrates a fan out device according to an example embodiment of the present invention.
Figure 6:
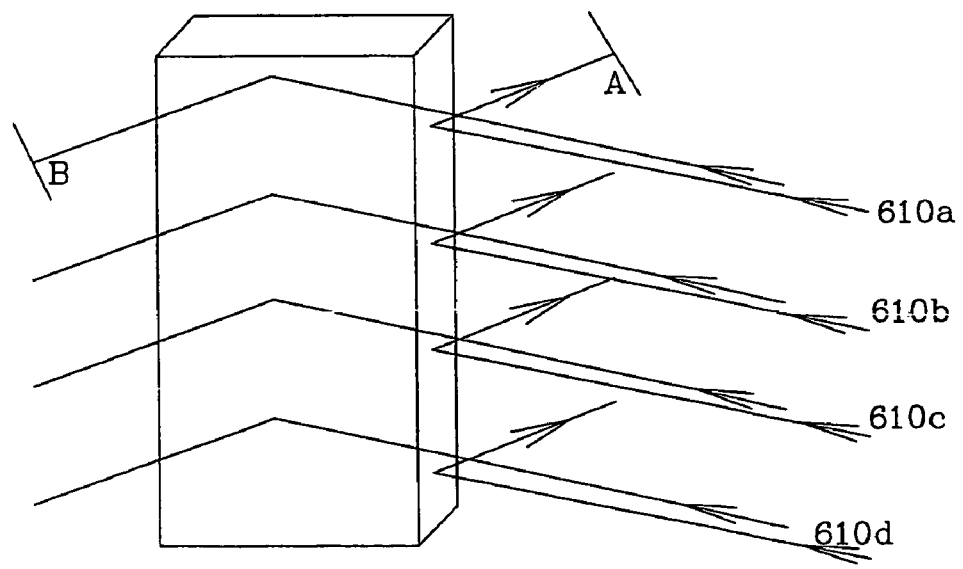
FIG. 6 illustrates a fan out device according to another example embodiment of the present invention.

FIG. 5 illustrates a reflective octagon 500, which may fan out incoming beams 510a, 510b, 510c, and 510d into a plurality of (e.g., four) different directions x, y, z, w. Along the directions x, y, z, and/or w, another fan out device or a spatial light modulator may be arranged. FIG. 6 illustrates a prism 600, which may fan out incoming beams 610a, 610b, 610c, and/or 610d into a plurality of directions (e.g., two different directions A and B). In this example, along the directions a and/or b another fan out device or a spatial light modulator may be arranged. The fan out device may be arranged in the optical path between the relay lens 118 and 218 and the SLMs 120 and 220 (not shown in FIGS. 1 or 2).

Each SLM in FIG. 2 may be positioned (e.g., mounted) on a module, which may supply data, purge gas, cool and/or perform mechanical alignment. This example module may need space, which may more easily be established by the fan out device.

A stage image detector may measure focus, translation, rotation, tilt and/or curvature/flatness of the SLM, and any deviation of specification of the focus, translation, rotation, tilt and curvature/flatness may be adjusted by an appropriate adjustment of the stage and/or a lens arrangement arranged between the spatial light modulator and the workpiece. A part of the alignment of the SLMs may also be performed in a data path, which may carry the pattern information to be loaded in the different SLMs. For instance, a rotational error of at least one of the SLMs may be performed by rotating the digital description of the pattern to be printed on the workpiece for at least one SLM.

While the example embodiments of the present invention have been disclosed and discussed above, it is understood that example embodiments of the present invention are intended to be illustrative rather than limiting. It is understood that modifications and/or may be made by those skilled in the art, and that those modifications and/or combinations will be within the spirit of the invention and the scope of the following claims.

I claim:

1. An apparatus for patterning a workpiece comprising:
at least two spatial light modulators configured to receive electromagnetic radiation from an electromagnetic radiation source, and relay the electromagnetic radiation toward the workpiece, the electromagnetic radiation being shaped into a first beam for illuminating at least one of the spatial light modulators; wherein
the first beam corresponds to a shape and size of the at least one spatial light modulators,
the first beam is split into at least two beams by a diffractive beam splitter, and
each of the at least two spatial light modulators is configured to receive a respective one of the at least two beams.

2. The apparatus according to claim 1, wherein the diffractive beam splitter is arranged in an optical plane.

3. The apparatus according to claim 1, wherein the relayed electromagnetic radiation forms images of the at least two spatial light modulators, the images being non-adjacent to each other.

4. The apparatus according to claim 1, wherein each of the at least two spatial light modulators include a plurality of pixel elements, and at least one of the at least two spatial light modulators is reflective or transmissive.

5. The apparatus according to claim 1, wherein at least one of the at least two spatial light modulators is operated in an analog mode or a digital mode.

6. The apparatus according to claim 1, wherein at least one of the at least two spatial light modulators forms an image on the workpiece during a first writing pass and at least one of the at least two spatial light modulators forms an image on the workpiece during a second writing pass.

7. The apparatus according to claim 6, wherein the at least two images produced by the at least two spatial light modulators have different patterns.

8. The apparatus according to claim 1, wherein the diffractive beam splitter is at least partially reflective.

9. The apparatus according to claim 2, wherein the diffractive beam splitter includes at least one of a volume holographic element (HOE), kinoforms, a Fresnel zone plate, and binary optical element (BOE).

10. The apparatus according to claim 8, wherein the diffractive beam splitter includes at least one of a prism and facetted mirror.

11. The apparatus according to claim 1, wherein the electromagnetic radiation source is a laser and the electromagnetic radiation is a laser beam.

12. The apparatus according to claim 11, wherein the laser beam has a wavelength of about 248 nm, about 193 nm, about 157 nm or about 13 nm.

13. The apparatus according to claim 1, wherein at least one of the at least two spatial light modulators is a grating light valve.

14. The apparatus according to claim 1, further including, a Fourier filter adapted to filter the electromagnetic radiation.

15. The apparatus according to claim 1, wherein at least two relayed images of the at least two spatial light modulators are patterned during at least a first and a second writing pass.

16. The apparatus according to claim 1, wherein object pixels included in one of the at least two spatial light modulators are at least one of a different size and a different shape relative to object pixels included in another of the at least two spatial light modulators.

17. The apparatus according to claim 1, wherein each of the at least two spatial light modulators are arranged on at least one corresponding manipulator.

18. The apparatus according to claim 1, wherein the at least two spatial light modulators are separated from each other at a distance larger than at least one image created by at least one of the at least two spatial light modulators.

19. The apparatus according to claim 1, wherein at least one image patterned by one of the at least two spatial light modulators in a first writing pass is displaced relative to an image patterned by another one of the at least two spatial light modulators in another writing pass.

20. The apparatus according to claim 1, wherein at least one image produced by one of the at least two spatial light modulators is displaced by at least a portion of at least one object pixel relative to another image produced by another one of the at least two spatial light modulators.

21. The apparatus according to claim 1, wherein images produced by each of the at least two spatial light modulators do not overlap each other.

22. The apparatus according to claim 1, wherein images produced by each of the at least two spatial light modulators at least partially overlap.

23. The apparatus according to claim 1, further including, a fan out device adapted to direct each of the at least two beams toward a corresponding one of the at least two spatial light modulators.

24. A method for patterning a workpiece, the method comprising:
shaping electromagnetic radiation into a first beam for illuminating at least two spatial light modulators, the first beam corresponding to a shape and size of at least one of the at least two spatial light modulators;
splitting, by a diffractive beam splitter, the first beam into at least two beams;
impinging each of the at least two beams on a respective one of the at least two spatial light modulators; and
patterning the workpiece by directing the electromagnetic radiation from the at least two spatial light modulators toward the workpiece.

25. The method according to claim 24, wherein images patterned on the workpiece are non-adjacent to each other.

26. The method according to claim 24, further including, reflecting each of the at least two beams such that each of the at least two beams impinge on the workpiece.

27. The method according to claim 24, wherein an image is patterned on a workpiece during a first writing pass and another image is patterned on the workpiece during a second writing pass.

28. The method according to claim 27, wherein each of the images have different patterns.

29. The method according to claim 24, wherein the electromagnetic radiation is a laser beam.

30. The method according to claim 29, wherein the laser beam has wavelength of about 248 nm, about 193 nm, about 157 nm or about 13 nm.

31. The method according to claim 24, further including, filtering the electromagnetic radiation in Fourier space.

32. The method according to claim 24, wherein at least two images are patterned during each of a first and a second writing pass.

33. The method according to claim 24, wherein at least one image patterned in a first writing pass is displaced relative to an image patterned in a second writing pass.

34. The method according to claim 33, wherein the at least one image patterned in a first writing pass is displaced a number of object pixels relative to the at least one image patterned in the second writing pass.

35. An apparatus for patterning a workpiece, the apparatus comprising:
at least two spatial light modulators configured to reflect a respective one of at least two beams of electromagnetic radiation, the reflected beams being directed toward the workpiece in order to pattern the workpiece;
a beam shaping unit configured to shape the electromagnetic radiation into a first beam for illuminating the at least two spatial light modulators, the first beam corresponding to a shape and size of at least one of the spatial light modulators;
a diffractive beam splitter configured to split the first beam into the at least two beams.

36. The apparatus of claim 1, wherein the at least two beams have shapes and sizes corresponding to the respective SLM on which they impinge.

37. The apparatus of claim 1, wherein each of the at least two beams impinges only on a respective one of the at least two SLMs.

* * * * *